United States Patent
Chung

(10) Patent No.: US 8,050,122 B2
(45) Date of Patent: Nov. 1, 2011

(54) FUSE APPARATUS FOR CONTROLLING BUILT-IN SELF STRESS AND CONTROL METHOD THEREOF

(75) Inventor: Jin-Il Chung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 350 days.

(21) Appl. No.: 12/266,521

(22) Filed: Nov. 6, 2008

(65) Prior Publication Data

US 2009/0154272 A1   Jun. 18, 2009

(30) Foreign Application Priority Data

Dec. 14, 2007   (KR) .................. 10-2007-0131035

(51) Int. Cl.
*G11C 29/00* (2006.01)
(52) U.S. Cl. .................. 365/201; 365/200; 365/225.7
(58) Field of Classification Search .................. 365/200, 365/201, 225.7
See application file for complete search history.

(56) References Cited

U.S. PATENT DOCUMENTS

| | | | |
|---|---|---|---|
| 5,263,031 A | 11/1993 | Inoue et al. | |
| 5,687,180 A | 11/1997 | Kawasaki et al. | |
| 5,901,105 A | 5/1999 | Ong et al. | |
| 6,115,836 A * | 9/2000 | Churchill et al. | 714/726 |
| 6,226,764 B1 * | 5/2001 | Lee | 714/718 |
| 6,367,042 B1 * | 4/2002 | Phan et al. | 714/733 |
| 6,651,202 B1 * | 11/2003 | Phan | 714/733 |
| 6,940,765 B2 | 9/2005 | Kyung et al. | |
| 2005/0138496 A1 * | 6/2005 | Brennan et al. | 714/718 |
| 2007/0104000 A1 * | 5/2007 | Lin et al. | 365/200 |
| 2009/0219775 A1 * | 9/2009 | Hur et al. | 365/201 |

FOREIGN PATENT DOCUMENTS

| | | |
|---|---|---|
| JP | 09-106698 | 4/1997 |
| JP | 2005-071582 | 3/2005 |
| KR | 1020020068768 A | 8/2002 |
| KR | 1020050106410 A | 11/2005 |
| KR | 1020070088718 A | 8/2007 |

OTHER PUBLICATIONS

Notice of Allowance issued from Korean Intellectual Property Office on Aug. 7, 2009 with an English Translation.
Hiroshi Ito, et al.,"Pure CMOS One-time Programmable Memory using Gate-Ox Anti-fuse," IEEE 2004 Custom Integrated Circuits Conference, 2004, pp. 469-472, IEEE.

* cited by examiner

*Primary Examiner* — Richard Elms
*Assistant Examiner* — Hien N Nguyen
(74) *Attorney, Agent, or Firm* — IP & T Group LLP

(57) ABSTRACT

A fuse apparatus for controlling a built-in self stress unit includes a built-in self stress configured to repeatedly generate any stress test pattern in a test mode, and generate a one-cycle end signal when one cycle for the generated stress test pattern has ended, and a fuse configured to record an operation state of the built-in self stress according to the one-cycle end signal. A method for controlling a built-in self stress includes repeatedly generating any stress test mode, in a test mode counting the generated stress test pattern, and activating a cycle end signal when a counting value reaches a predetermined value, and recording an operation state of the built-in self stress in a fuse on the basis of the counted value.

14 Claims, 4 Drawing Sheets

FUSE APPARATUS FOR CONTROLLING BUILT-IN SELF STRESS AND CONTROL METHOD THEREOF

CROSS-REFERENCE TO RELATED APPLICATIONS

The present invention claims priority of Korean patent application number 10-2007-0131035, filed on Dec. 14, 2007, which is incorporated by reference in its entirety.

BACKGROUND OF THE INVENTION

The present invention relates to a fuse apparatus for controlling a built-in self stress, and more particularly, to a fuse apparatus and a control method thereof, which can control whether a built-in self stress (BISS) unit is normally operated in a semiconductor memory device.

Generally, a test for a semiconductor memory device (hereinafter, referred to as a memory) requires a large amount of test patterns and control/watch for all the input/output pins of a memory. Accordingly, in a case where a memory is built into the integrated circuit, a test pattern implemented in hardware is built into an integrated circuit together with the memory because of a routing issue, limitation for the number of package pins, the length of a test program, etc.

A screen test is performed for early elimination of memory errors. In the screen test, testing the operation of a memory by applying high temperature/high pressure is called a stress built-in self test (BIST).

The BIST applies suitable voltages to a memory according to test modes, and thereafter measures patterns for the program state and erase state of the memory. Moreover, passing and failing in a corresponding test mode is determined by comparing patterns required in the program state and erase state of the memory with measurement patterns for a programmed state and an erased state according to the test modes.

To perform the BIST, external test equipment should provide various patterns of a test mode to the BIST. In this case, the built-in self stress is used as an apparatus for generating a stress test pattern for the test of a memory, and is built into a single chip together with a memory device.

In a case where a memory is tested by the BIST, a stress test pattern generated in the built-in self stress is used, and thus it is necessary to output and monitor whether the stress test pattern is normally generated in the built-in self stress.

However, when it is impossible to use an external output due to the environment in which equipment is provided, a user cannot check whether the operation of the built-in self stress is in a normal state.

SUMMARY OF THE INVENTION

Embodiments of the present invention are directed to providing a fuse apparatus for controlling built-in self stress and a control method thereof, which can check whether the operation of a built-in self stress (BISS) unit is in a normal state.

In accordance with an aspect of the invention, a built-in self stress is configured repeatedly to generate any stress test pattern in a test mode, and generate a one-cycle end signal when one cycle for the generated stress test pattern has ended and a fuse configured to record a operation state of the built-in self stress according to the one-cycle end signal.

In accordance with other aspect of the invention, a built-in self stress is configured repeatedly to generate any stress test pattern in a test mode, and generate one-cycle end signal when one cycle for the generated stress test pattern has ended, a counter is configured to count the one-cycle end signal generated in the built-in self stress, a comparator is configured to compare the output of the counter with a predetermined value, and a fuse is configured to record the output of the comparator to record a operation state of the built-in self stress.

In accordance with other aspect of the invention, control is provided to repeatedly generate any stress test mode in a test mode, the generated stress test pattern is counted, and a cycle end signal is activated when an output value of the counter reaches a predetermined value and an operation state of the built-in self stress in a fuse is recorded on the basis of the counted value.

DESCRIPTION OF SPECIFIC EMBODIMENTS

Hereinafter, a fuse apparatus for controlling built-in self stress and a control method thereof in accordance with the present invention will be described in detail with reference to the accompanying drawings.

Figure 1:
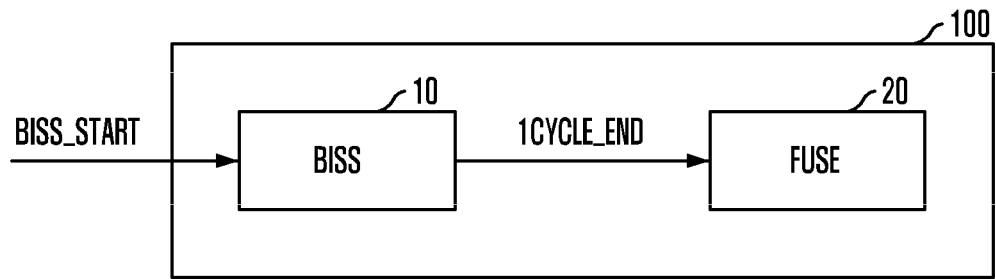
FIG. 1 is a block diagram of a fuse apparatus for controlling a built-in self stress in accordance with an embodiment of the present invention.

FIG. 1 is a block diagram of a fuse apparatus for controlling a built-in self stress in accordance with an embodiment of the invention.

Referring to FIG. 1, when a signal BISS_START indicating the generation of a stress test pattern is input to a built-in self stress (BISS) unit 10 from outside of the built-in self stress 10, the built-in self stress 10 repeatedly generates any stress test pattern. The generated stress test pattern, although not shown, is provided to a built-in self test (BIST) and used as a signal for the test of a memory. When one cycle for an internal stress test pattern has ended, the built-in self stress 10 generates a one-cycle end signal 1CYCLE_END and records the one-cycle end signal 1CYCLE_END in a fuse 20, wherein the record denotes whether a fuse cell in the fuse 20 is cut or not. When one cycle for a stress test pattern has ended in the inside of the built-in self stress 10, the one-cycle end signal 1CYCLE_END is activated and provided to the fuse 20. At this point, the fuse 20 records the one-cycle end signal 1CYCLE_END.

Figure 2:
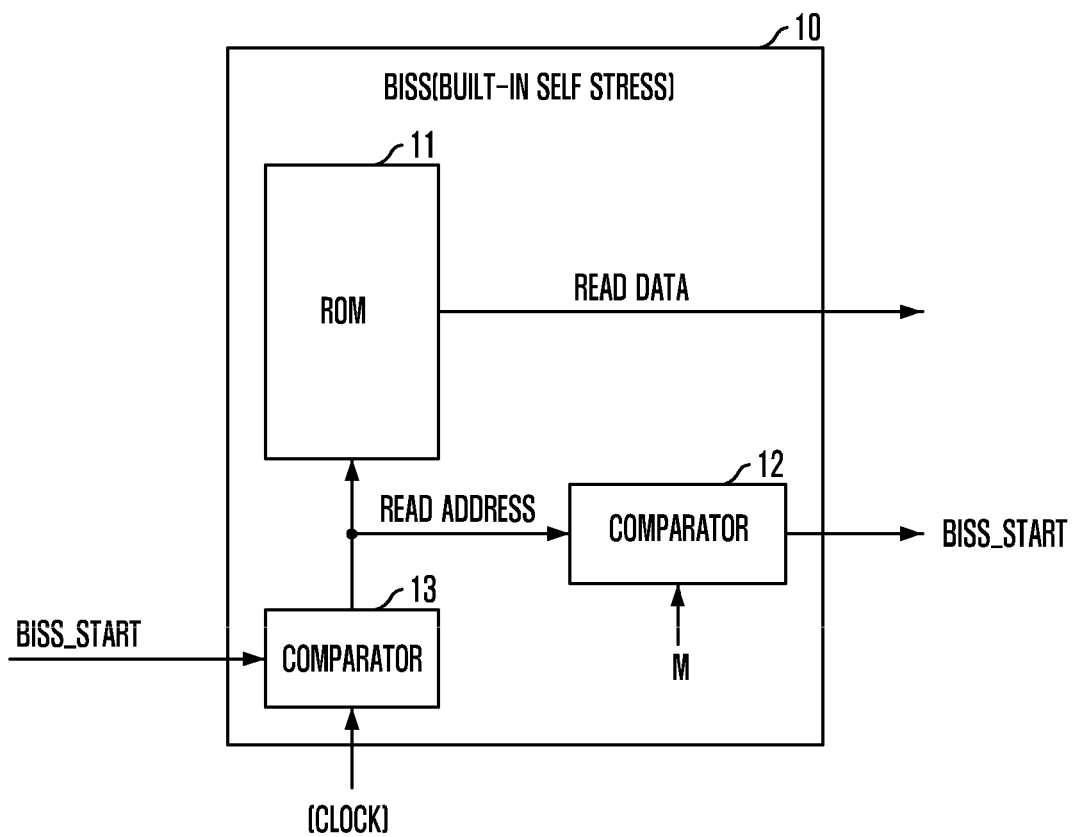
FIG. 2 is a detail block diagram illustrating an embodiment of a built-in self stress in accordance with an embodiment of the invention.

FIG. 2 is a detail block diagram illustrating an embodiment of a built-in self stress in accordance with an embodiment of the invention.

Referring to FIG. 2, the built-in self stress 10 repeatedly generates any stress test pattern, and generates the one-cycle end signal 1CYCLE_END when one cycle for the generated stress test pattern has ended. Accordingly, since the built-in self stress 10 repeatedly generates any stress test pattern stored in advance, a device for comparing the generated stress test pattern with a prediction output is unnecessary. Only a process is required that checks whether a constant amount of stress test patterns are normally generated. For this, a counter 13 operates according to an external test signal. The counter 13 is included in the built-in self stress 10 to count a signal. Furthermore, the counter 13 counts an external clock signal CLOCK and outputs the counted value. The output value of the counter 13 is provided to a read-only memory (ROM) 11 and a comparator 12. The comparator 12 compares a value M corresponding to one cycle with the output value of the counter 13, and generates the one-cycle end signal 1CYCLE_END having logic high level when the output value of the counter 13 reaches the value M. The ROM 11 stores all sorts of control/address/data signals for a circuit receiving a self stress, and outputs any stress test pattern, which is stored in advance, to the BIST on the basis of the output value of the counter 13.

Figure 3:
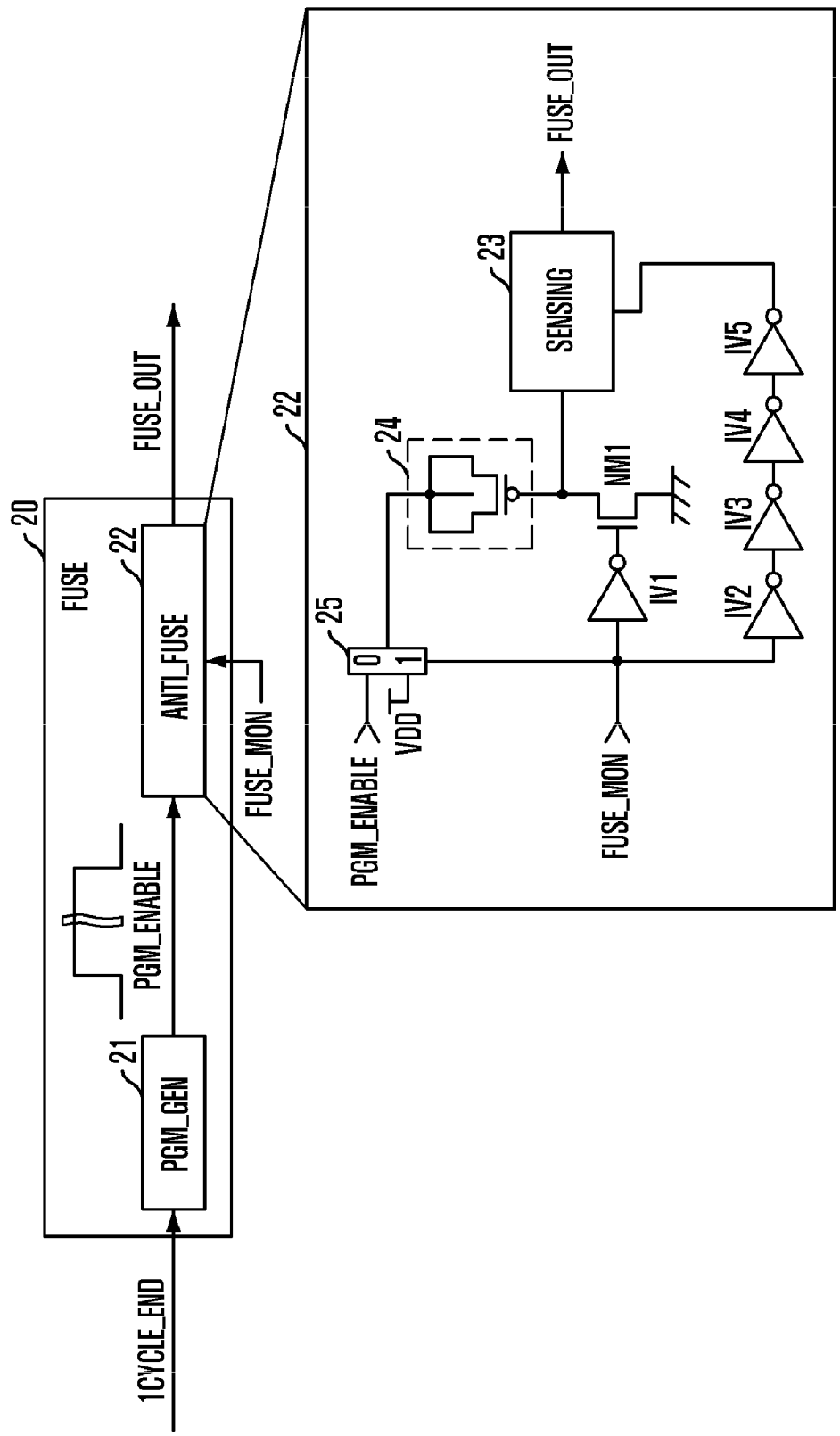
FIG. 3 is a detail block diagram of a fuse in accordance with an embodiment of the invention.

FIG. 3 is a detail block diagram of a fuse in accordance with an embodiment of the invention.

Referring to FIG. 3, the fuse 20 includes a program enable generator 21 and an anti-fuse 22. Herein, the program enable generator 21 generates a program enable signal PGM_ENABLE recorded in the anti-fuse 22 in response to the one-cycle end signal 1CYCLE_END.

The program enable generator 21 receives a voltage of a higher level than an external power supply voltage. When the one-cycle end signal 1CYCLE_END is applied, the program enable generator 21 generates the program enable signal PGM_ENABLE for cutting or rupturing the fuse 20. The pulse width of the program enable signal PGM_ENABLE must be the same as time which is spent in cutting or rupturing the fuse 20, and a level of a voltage must be higher than that of a power supply voltage.

The anti-fuse 22 can be cut or ruptured in the inside of a chip without the help of external equipment. Generally, a fuse is cut by the flow of a high current, and a fuse is ruptured by the application of a high voltage. As illustrated in FIG. 3, the anti-fuse 22 includes a power supply input terminal 25, an anti-fuse cell 24, a sensor 23, a plurality of inverters IV1 to IV5, and a MOS transistor MN1. The anti-fuse cell 24 has a cut state in an initial state. That is, when the one-cycle end signal 1CYCLE_END is input to the fuse 20, the program enable signal PGM_ENABLE having logic high level is input to the anti-fuse 22. Therefore, in a state where a fuse monitor signal FUSE_MON is maintained at logic low level, the anti-fuse cell 24 is ruptured by the high voltage difference between both ends of the anti-fuse cell 24. Consequently, the programming of the fuse 22 according to the end of one cycle is performed.

When the program enable signal PGM_ENABLE having logic low level and the fuse monitor signal FUSE_MON having logic high level are input, a high signal having logic high level is input to the sensor 23 in a state where the anti-fuse cell 24 is ruptured, whereas a low signal having logic low level is input to the sensor 23 in a state where the anti-fuse cell 24 is cut.

Figure 4:
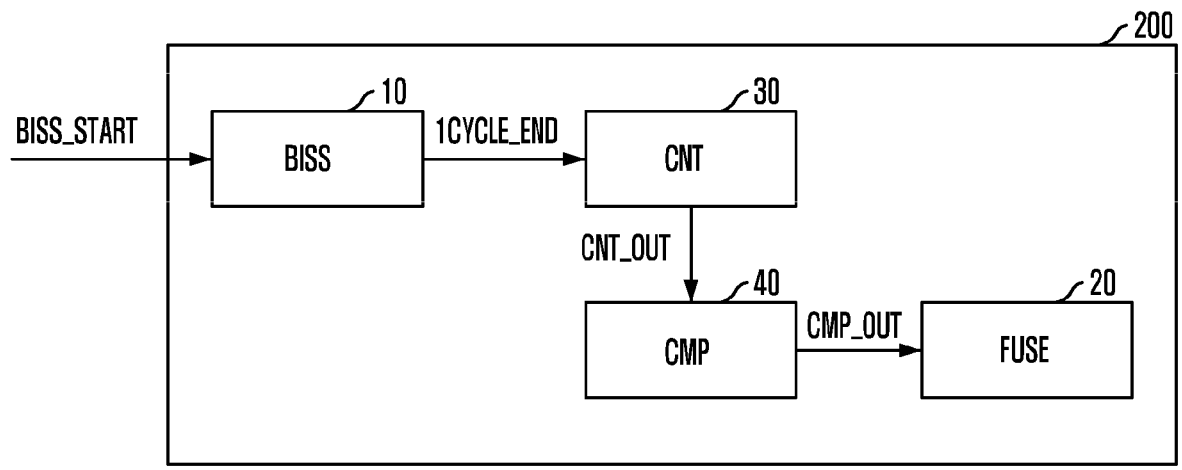
FIG. 4 is a block diagram of a fuse apparatus for controlling a built-in self stress in accordance with another embodiment of the invention.

FIG. 4 is a block diagram of a fuse apparatus for controlling built-in self stress in accordance with another embodiment of the invention.

Referring to FIG. 4, when the signal BISS_START indicating the generation of a stress test pattern is input to the built-in self stress (BISS) unit 10 from the outside of the built-in self stress 10, the built-in self stress 10 repeatedly generates any stress test pattern. The generated stress test pattern, although not shown, is provided to the BIST and used as a signal for the test of a memory. Moreover, the built-in self stress 10 generates the one-cycle end signal 1CYCLE_END according to one cycle when one cycle for an internal stress test pattern has ended, and records the one-cycle end signal 1CYCLE_END in a fuse 20 when a predetermined N cycles has ended. That is, the built-in self stress 10 generates the one-cycle end signal 1CYCLE_END when one cycle for the stress test pattern has ended. At this point, the one-cycle end signal 1CYCLE_END is activated and is input to a counter 30. The counter 30 increases an internal count value by the one-cycle end signal 1CYCLE_END. The output CNT_OUT of the counter 30 is input to a comparator 40.

The comparator 40 compares the output value of the counter 30 with a predetermined value (N). When the output value of the counter 30 is the same as the predetermined value (N) as a result of the comparison, the output CMP_OUT of the comparator 40 is activated and is input to a fuse 60. The fuse 60 records the output CMP_OUT of the comparator 40.

The configuration of the fuse 60 is the same as that of the fuse 20 of FIG. 3, but there is a difference in that the fuse 20 records the one-cycle end signal 1CYCLE_END whereas the fuse 20 does not record the one-cycle end signal 1CYCLE_END. In another embodiment of the invention illustrated in FIG. 4, the counter 30 records the one-cycle end signal 1CYCLE_END whenever one cycle has ended, and the fuse 60 records the output CMP_OUT of the comparator 40 when the output CNT_OUT of the counter 30 reaches the predetermined value (N). That is, there are differences between the fuse 20 and the fuse 60.

Figure 5:
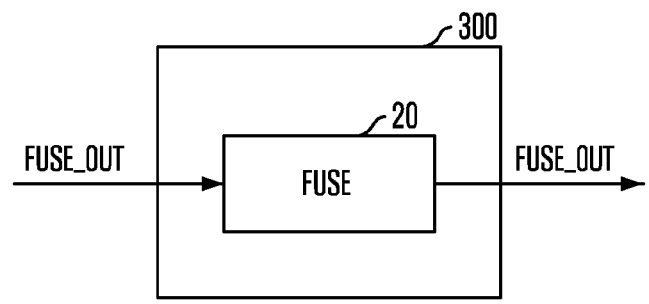
FIGS. 5 and 6 are a block diagram for describing a method of monitoring a signal recorded in a fuse 20 of FIGS. 1 and 3.
Figure 6:
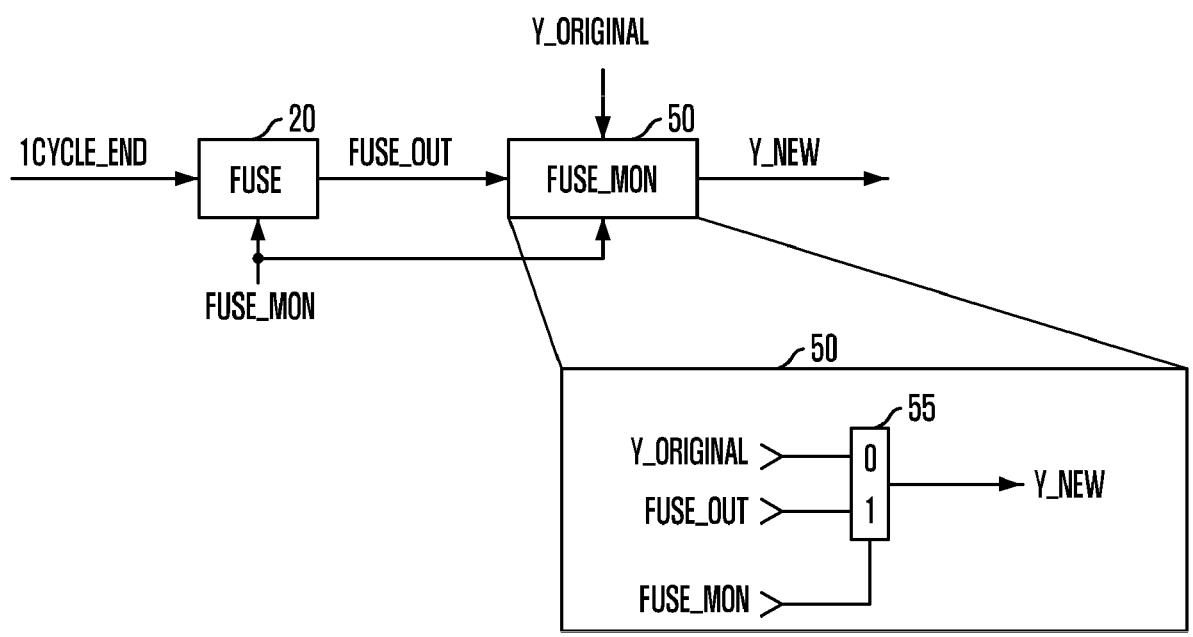

FIGS. 5 and 6 are block diagrams for describing a method of monitoring a signal recorded in a fuse 20 of FIGS. 1 and 3.

Referring to FIGS. 5 and 6, a signal recorded in the fuse 20 is checked through a subsequent test process. At this point, it is assumed that an output of the test can be visible to a user. That is, the fuse monitor signal FUSE_MON is applied to the fuse 20 through an external input, and a fuse state recorded in the fuse 20 is output as a fuse output FUSE_OUT, being an external output.

As a result, the fuse 20 generates the fuse output FUSE_OUT according to the one-cycle end signal 1CYCLE_END generated in the built-in self stress 10. When a fuse monitor 50 is not in a normal state but a test mode, a fuse monitor 50 monitors internal information, i.e., a fuse state, through an output pin. As an example, the fuse monitor 50 is designed with a multiplexer configured to receive a corresponding test mode signal as a selection signal.

Accordingly, since the fuse monitor signal FUSE_MON has logic low level in a normal operation, the fuse monitor 50 outputs a signal Y_ORIGINAL as a signal Y_NEW through an output terminal 55. However, when monitoring the fuse 20, the fuse monitor signal FUSE_MON has a logic high level so that the fuse monitor 50 outputs the fuse output FUSE_OUT of the fuse 20 as a signal Y_NEW through the output terminal 55.

Embodiments of the invention cut a fuse (an anti-fuse is ruptured) when a stress test pattern generated in the built-in self stress ends one cycle or N cycles. Embodiments of the invention display the state of a fuse to the outside of the built-in self stress and allow a user to check whether the fuse is cut or not, thereby enabling the user to monitor whether the operation of the fuse is in a normal state. Accordingly, the user can accurately determine whether the operation of the built-in self stress is in a normal state.

Embodiments of the above-described invention are disclosed for the purposes of examples, and are applied to an apparatus which records whether the built-in self stress operates to a fuse.

While the invention has been described with respect to the specific embodiments, it will be apparent to those skilled in the art that various changes and modifications may be made without departing from the spirit and scope of the invention as defined in the following claims.

What is claimed is:

1. A fuse apparatus for controlling a built-in self stress, comprising:
   a built-in self stress unit configured repeatedly to generate any stress test pattern in a test mode, and generate a one-cycle end signal when one cycle for the generated stress test pattern has ended; and
   a fuse configured to record an operation state of the built-in self stress according to the one-cycle end signal.

2. The fuse apparatus as recited in claim 1, wherein the built-in self stress includes
   a counting unit configured to count with a test mode start signal,
   a comparator configured to compare the output of the counting unit with a value corresponding to one cycle to activate the one-cycle end signal, and
   a ROM configured to output a stress test pattern on the basis of the output of the counter.

3. The fuse apparatus as recited in claim 1, wherein the fuse includes
   a program enable generator configured to generate a program enable signal recorded in the fuse according to the one-cycle end signal, and
   an anti-fuse configured to record a fuse monitor signal by being ruptured by the program enable signal.

4. The fuse apparatus as recited in claim 3, wherein the program enable generator compares the one-cycle end signal with an external power supply voltage to generate the program enable signal having a voltage of a higher level than that of the external power supply voltage.

5. The fuse apparatus as recited in claim 3, wherein the anti-fuse includes
   an input terminal configured to generate a high signal by the program enable signal,
   an anti-fuse cell ruptured according to the program enable signal applied through the input terminal, and
   a sensor configured to sense whether the anti-fuse cell is ruptured.

6. The fuse apparatus as recited in claim 5, wherein the anti-fuse cell has an open state in an initial state.

7. The fuse apparatus as recited in claim 6, wherein the anti-fuse further comprises a switch configured to control providing a current pass of the anti-fuse cell according to the fuse monitor signal.

8. The fuse apparatus as recited in claim 5, wherein the sensor outputs a sense signal representing whether the anti-fuse cell is ruptured according to the fuse monitor signal.

9. A fuse apparatus for controlling a built-in self stress, comprising:
   a built-in self stress unit configured to repeatedly generate any stress test pattern in a test mode, and generate a one-cycle end signal when one cycle for the generated stress test pattern has ended;
   a counting unit configured to count the one-cycle end signal generated in the built-in self stress unit;
   a comparator configured to compare the output of the counter with a predetermined value; and
   a fuse configured to record the output of the comparator to record an operation state of the built-in self stress unit.

10. The fuse apparatus as recited in claim 9, wherein the built-in self stress unit includes
    a counter configured to count with a test mode start signal,
    a comparator configured to compare the output of the counter with a value corresponding to one cycle to activate the one-cycle end signal, and
    a ROM configured to output a stress test pattern on the basis of the output of the counting unit.

11. A method for controlling a built-in self stress, comprising:
    repeatedly generating any stress test mode in a test mode;
    counting the generated stress test pattern, and activating a cycle end signal when an counting value reaches a predetermined value; and
    recording an operation state of the built-in self stress in a fuse on the basis of the counted value.

12. The method as recited in claim 11, wherein the recording of the fuse includes
    generating a program enable signal for recording in the fuse according to the cycle end signal, and
    changing an anti-fuse cell into a ruptured state according to the program enable signal.

13. The method as recited in claim 11, further comprising outputting a signal recorded in the fuse according to a fuse monitor signal.

14. The method as recited in claim 13, wherein the outputting of the signal is performed outputting a signal representing whether the anti-fuse cell is ruptured according to the fuse monitor signal.

* * * * *